United States Patent
Lancia et al.

(10) Patent No.: US 12,204,298 B2
(45) Date of Patent: Jan. 21, 2025

(54) METHODS OF MODELLING SYSTEMS FOR PERFORMING PREDICTIVE MAINTENANCE OF SYSTEMS, SUCH AS LITHOGRAPHIC SYSTEMS

(71) Applicant: ASML NETHERLANDS B.V., Veldhoven (NL)

(72) Inventors: Carlo Lancia, Eindhoven (NL); Anjan Prasad Gantapara, Veldhoven (NL); Dirk-Jan Kernkamp, 's-Hertogenbosch (NL); Seyed Iman Mossavat, Waalre (NL); Alexander Ypma, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 385 days.

(21) Appl. No.: 17/801,980

(22) PCT Filed: Feb. 4, 2021

(86) PCT No.: PCT/EP2021/052590
§ 371 (c)(1),
(2) Date: Aug. 24, 2022

(87) PCT Pub. No.: WO2021/175533
PCT Pub. Date: Sep. 10, 2021

(65) Prior Publication Data
US 2023/0138469 A1   May 4, 2023

(30) Foreign Application Priority Data

Mar. 6, 2020  (EP) .................................... 20161346
May 14, 2020  (EP) .................................... 20174756

(51) Int. Cl.
  *G05B 13/04*   (2006.01)

(52) U.S. Cl.
  CPC ......... *G05B 13/048* (2013.01); *G05B 13/042* (2013.01)

(58) Field of Classification Search
  None
  See application file for complete search history.

(56) References Cited

U.S. PATENT DOCUMENTS

| 11,994,848 B2 * | 5/2024 | Onvlee ............ G05B 19/41885 |
| 2018/0267523 A1 | 9/2018 | Sigtermans et al. |
| 2019/0156226 A1 * | 5/2019 | Ouyang ................. G06N 5/045 |

FOREIGN PATENT DOCUMENTS

| EP | 3379356 | 9/2018 |
| WO | 2020212057 | 10/2020 |

OTHER PUBLICATIONS

International Search Report and Written Opinion issued in corresponding PCT Patent Application No. PCT/EP2021/052590, dated Apr. 9, 2021.

(Continued)

*Primary Examiner* — Ryan A Jarrett
(74) *Attorney, Agent, or Firm* — Pillsbury Winthrop Shaw Pittman, LLP (57) ABSTRACT

A method of tuning a prediction model relating to at least one particular configuration of a manufacturing device. The method includes obtaining a function including at least a first function of first prediction model parameters associated with the at least one particular configuration, and a second function of the first prediction model parameters and second prediction model parameters associated with configurations of the manufacturing device and/or related devices other than the at least one particular configuration. Values of the first prediction model parameters are obtained based on an optimization of the function, and a prediction model is tuned (Continued)

according to these values of the first prediction model parameters to obtain a tuned prediction mode.

20 Claims, 2 Drawing Sheets

(56) References Cited

OTHER PUBLICATIONS

Wan, J. et al.: "*A Manufacturing Big Data Solution for Active Preventive Maintenance*"; IEEE Transactions in Industrial Informatics, vol. 13, No. 4 (Aug. 1, 2017).
Susto, G.A. et al.: "*Dealing with Time-Series Data in Predictive Maintenance Problems*", IEEE 21st International Conference on Emerging Technologies and Factory Automation (EFTA), pp. 1-4 (Sep. 6, 2016).
Polson, N.G. et al: *Proximal Algorithms in Statistics and Machine Learning*; Statistical Science. vol. 30, No. 4, arxiv.org/pdf/1502.03175.pdf (2015).
Smola, A.J. et al.: "*Kernels and Regularization on Graphs*", in: Schölkopf, B., Warmuth, M.K. (eds) Learning Theory and Kernel Machines. Lecture Notes in Computer Science(), vol. 2777. Springer, Berlin, Heidelberg (2003).

\* cited by examiner

METHODS OF MODELLING SYSTEMS FOR PERFORMING PREDICTIVE MAINTENANCE OF SYSTEMS, SUCH AS LITHOGRAPHIC SYSTEMS

CROSS-REFERENCE TO RELATED APPLICATIONS

This application is the U.S. national phase entry of PCT Patent Application No. PCT/EP2021/052590 which was filed on Feb. 4, 2021, which claims priority of European Patent Application No. 20161346.0 which was filed on 6 Mar. 2020 and of European Patent Application No. 20174756.5 which was filed on 14 May 2020, which are incorporated herein in their entireties by reference.

FIELD OF INVENTION

The present invention relates to predictive maintenance of systems generally and to methods for modelling such systems. More specifically, the present invention relates to systems and techniques that are used to process data from such models.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

It is desirable to model operation of lithographic systems or apparatuses (or systems in general). This may comprise monitoring parameter values of the lithographic system and making predictions of future performance or events based on these parameter values using a model of the system operation. The disclosure herein describes a number of proposals for addressing issues relating to such predictive maintenance of lithographic systems, or systems in general.

SUMMARY OF THE INVENTION

The invention in a first aspect provides a method of tuning a prediction model relating to at least one particular configuration of a manufacturing device, the method comprising: obtaining a function comprising at least a first function of first prediction model parameters associated with said at least one particular configuration and a second function of the first prediction model parameters, and second prediction model parameters associated with configurations of the manufacturing device and/or related devices other than the at least one particular configuration; obtaining values of the first prediction model parameters based on an optimization of the function; and tuning a prediction model according to said values of the first prediction model parameters to obtain a tuned prediction model.

The invention yet further provides a computer program product comprising machine-readable instructions for causing a processor to perform the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
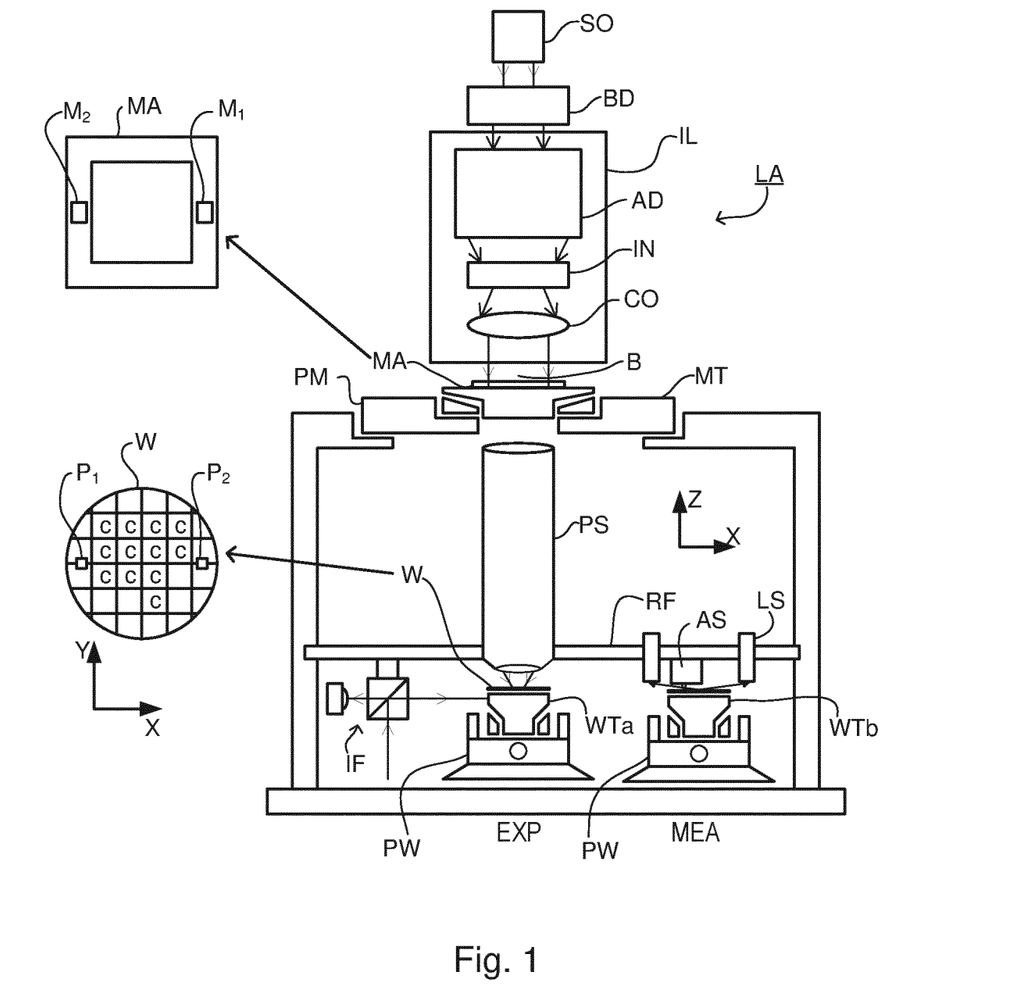
FIG. 1 depicts a lithographic apparatus.

FIG. 1 schematically depicts a lithographic apparatus LA. The apparatus includes an illumination system (illuminator) IL configured to condition a radiation beam B (e.g., EUV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
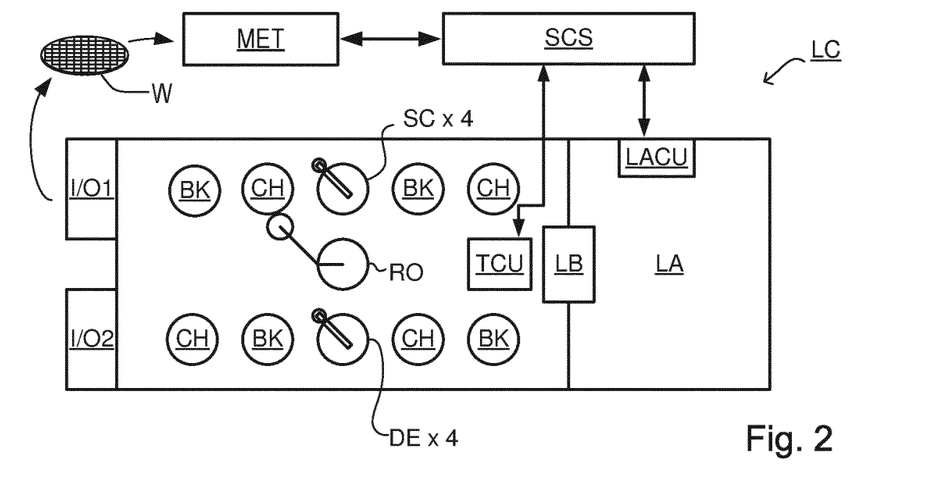
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Computer modeling techniques may be used to predict, correct, optimize and/or verify performance of a system. Such techniques may monitor system data such as one or more physical quantities and/or machine settings and predict, correct, optimize and/or verify system performance based on values of this system data. The computer model may be constructed using historical data, and may be constantly updated, improved or monitored by comparing predictions of model parameter values to corresponding system data. In particular, such computer modelling techniques may be used to predict, correct, optimize and/or verify system performance of a lithography system or process; and more specifically enable predictive maintenance of such a lithography system or process.

For the models to properly represent complex systems such as lithographic systems, there is a requirement for there to be sufficient data available for the models to be sufficiently trained, configured and/or tuned. However, lithographic systems are not commonplace apparatuses and as such, the number of operational lithographic systems from which data can be obtained is limited. In addition, these systems are constantly evolving via technological advancements, resulting in system heterogeneity. There are many different types of systems (different platforms or product lines), and even when systems are similar (e.g., the same platform or product line) there may be smaller configurational differences (e.g., component differences, software differences) depending on the exact specification stipulated, age and/or maintenance history. Because of this, the datasets associated with each of these sub-systems are inherently limited: while the various datasets, associated with different sub-systems, have certain commonalities, each dataset has its own specific characteristics reflecting the differences or slight changes across systems or drifts and evolution over time.

Subcomponent replacement and part maintenance is typically done on a reactive basis, such that malfunctioning components are only investigated and repaired/replaced when an issue is noticed, with the inevitable consequence of unexpected down time and therefore cost in terms of performance and yield. In addition, unexpected breakdowns tend to cause escalations which disrupts other parties along the manufacturing and supply chain. As an alternative to reactive maintenance, other strategies may include:

Periodic Maintenance. Parts/subcomponents are replaced at regular intervals to avoid unexpected machine downtime. This can be wasteful in that machines may be taken offline and parts replaced with unnecessary frequency, or if not sufficiently frequent might not prevent unscheduled downtime and repairs.

Optimized Planned Maintenance. Parts are replaced or serviced collectively, which may be even more wasteful in terms of unnecessary part replacement.

Transfer entropy assisted root cause analysis. Root cause analysis for malfunctioning components using Transfer Entropy causal methods has been described in US 2018/0267523 A1, which is incorporated herein by reference. However, a causal graph only tells you how impacts are propagated within a system; it does not help with the heterogeneity in the data and therefore the small amount of data available per configuration.

Predictive Maintenance. This comprises the building of numerous models which predict behavior of the different elements of the system. In many (e.g., consumer) industrial applications, the systems and components are often mass produced, providing a large number of data sources from which the predictive models may be built. However, this wealth of data is not available for lithography systems.

To provide a specific example, a failure prediction (e.g., for a specific subcomponent) may be based on online scanner data, on the premise that a failed subcomponent will generate distinct patterns, as compared to normal behavior, in the data. For example, cross-validated metrics on a training set may be good e.g., with an ROC AUC (receiver operating characteristic—area under curve) above 0.90; while the same model evaluated on the test or live data may show much poorer performance (ROC AUC around 0.60). A further investigation may attribute this performance drop to variation across datasets of key parameters, such as the scanner type or the subcomponent version. Such configuration changes among and within datasets affect the observed patterns and capture commonalities across individual instances; however, they are statistically associated with the subcomponent failure. Yet, these parameters cannot be used as predictors because, due to the small sample size, they would be sufficient to perfectly separate failed from non-failed instances; the predictive performance of such model would likely not generalize to new/live data.

As such, prediction accuracy for an (upcoming) failure for a specific configuration suffers from low data volume. The alternative, simply aggregating all the data from all configurations into an accumulated dataset would tend to lead to overfitting/underfitting problems (model generalization not achieved).

To illustrate this, suppose there are datasets $D_1$ to $D_m$ where each of these datasets $D_i$ corresponds to a different particular configuration (e.g., a different combination of sub-component and system type). Suppose the model which corresponds to dataset $D_i$ comprises parameters $\omega_i$. In a general scheme a cost function $F(D_i, \omega_i)$ may be optimized to train the model parameters $\omega_i$ based on dataset $D_i$, e.g.:

$$\operatorname*{argmin}_{\omega_i} F(D_i, \omega_i)$$

This approach independently solves each optimization problem individually, without taking advantage of any similarity in the different datasets. As already mentioned, aggregating the data from all datasets into one "super" dataset is possible, but would ignore the variations across different datasets.

To address this issue, a computational framework and associated method is provided for predictive maintenance purposes (for any production apparatus or tool, e.g., a lithography tool), wherein the prediction model comprises a first component optimized for a population of tools having different configurations, and a second component based on knowledge/behavior of configurations with respect to each other.

The computational framework and associated method may use a cost function for model parameters of a predictive maintenance model which is based on datasets from multiple configurations while taking advantage of the similarity between the datasets. To ensure that the configuration specific behavior is reflected in the solution, the proposed cost function comprises a configuration specific component (the first component), and a regularization term (the second component) which takes the coupling of configuration specific model parameters into account. This regularization term may, for example be based on domain knowledge, e.g., due to one or more common physical principles which impose a similar response of a scanner observable to a component state.

Figure 3:
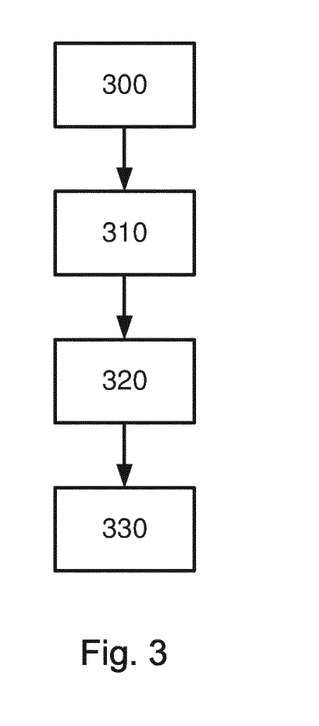
FIG. 3 is a flowchart describing a method according to an embodiment of the invention.

FIG. 3 is a flowchart describing a method according to an embodiment. The method comprises at step 300, obtaining a cost function comprising at least a first function of first prediction model parameters associated with a particular configuration and a second function (or regularization function) of the first prediction model parameters and of second prediction model parameters associated with other configurations. At step 310, values of the first prediction model parameters are obtained based on an optimization of the function. At step 320, a prediction model is tuned according to said values of the first prediction model parameters to obtain a tuned prediction model. Finally, at step 330, the tuned prediction model is used to predict a characteristic of the particular configuration (e.g., a failure probability or time or other maintenance related characteristic).

In general terms, the cost function to optimized may (as an example) takes the form:

$$\operatorname*{argmin}_{\omega_1, \ldots, \omega_m} \sum_i F_i(D_i, \omega_i) + \lambda G(\omega_1, \ldots, \omega_m)$$

wherein the regularization term $G(\bullet)$ relates or links the different optimization problem per dataset and $\lambda$ is a weighting which may take the role of a Lagrange multiplier. As such, the regularization term $G(\bullet)$ may regularize per-dataset variations based on a similarity of the solutions. In this way, every dataset can still have an individual solution, but the variation across the solutions can now be controlled by the regularization term $G(\bullet)$. The weighting $\lambda$ enables a simulated annealing or a control of the importance of the global regularization with respect to single model contributions while searching for the global minimum.

The specific implementation of $G(\bullet)$ may not explicitly depend on all of the hyperparameters $\omega_i^j \in \omega_i$, i=1, ..., m. This may be the case where the jth hyperparameter of the ith model is not regularized across the datasets $D_1, \ldots, D_m$, or it is not regularized at all.

The definition of the regularization term $G(\bullet)$ may involve domain expertise so as to encode prior knowledge. In an example, a $L_1$- or $L_2$-norm regularization is utilized. In another example regularization takes known (expected) correlation strengths between model parameters across configurations into account. Other examples may use a Bayesian inference framework. In the Bayesian framework the function G is the log of the prior. The function F is the logarithm of the likelihood function. In the Bayesian framework instead of optimizing the cost function we sample from the posterior corresponding to the prior and likelihood. In other words, we can calculate the exp (F+G) and normalize it, which gives us the Bayesian joint probability. Other regularization approaches may be based on Transfer Entropy techniques (e.g., any of the transfer Entropy causal methods described in US 2018/0267523), domain driven hierarchical structures and generic-complexity control priors. Some of these examples and others will now be described in greater detail, for illustration.

In a more straightforward example, the regularization term G(•) may comprise a $L_2$-norm regularization of solutions over some nominal value (e.g., which can encode prior knowledge); e.g.:

$$G(\omega_1, \ldots, \omega_m) = \sum_i (\omega_i - \mu)^2; \text{where:} \mu = \frac{\sum_i \omega_i}{m}$$

as such, ρ is the empirical mean of the solutions; i.e., the aggregated solution at the higher level of the hierarchy.

In another example, applicable where the different datasets have a relation specified by a undirected graph with graph Laplacian $\mathcal{L}$. Then:

$$G(\omega_1, \ldots, \omega_m) = [\omega_1 \ \ldots \ \omega_m] \mathcal{L} \begin{bmatrix} \omega_1 \\ \vdots \\ \omega_m \end{bmatrix}$$

regularizes the solutions with respect to graph. This functions is equal to:

$$G(\omega_1, \ldots, \omega_m) = \sum_{i \sim j} W_{i,j}(\omega_i - \omega_j)^2$$

Where i~j denotes that nodes i and j are neighbors. W is the adjacency matrix corresponding to the undirected graph. For more detail on the general concept, reference can be made to the publication: AJ Smola, R Kondor—*Learning theory and kernel machines*, 2003—Springer, which is hereby incorporated by reference.

The concepts described above may be extended into a hierarchical Bayesian framework for a particular choice of F and G. For example, domain knowledge in combination with existing models, may provide an initial failure prediction function for a new component/configuration (or one for which there is very little data), with this domain knowledge or a belief inferred therefrom encoded in prior(s). Newly added (e.g., failure) data may be used to update the prior(s); hence the failure prediction model gradually improves (is updated over time) using the Bayesian inference framework.

In an embodiment, the effect of the Bayesian framework may be to mix information between different datasets/configurations, so as to compensate for configurations which have no or little associated data. For example, if two or more datasets show a shared trend, then it may be inferred (with a certain level of confidence based on factors such as how many configurations also show this trend, the strength of the trend etc.) that the new configuration will also show this trend. Therefore, the Bayesian framework may comprise co-optimizing over all datasets, such that any shared trend will be reflected in the initial failure prediction function for the configuration(s) having no or little data. Therefore, existing models for existing parts/configurations, along with domain knowledge for new e.g., associated) products/parts can be used as a prior to the new model for predicting the behaviour (e.g., failure time or breakdown) of the new part. By way of a specific example, a model built on data for a first type of optical element may be used as a prior to for a failure prediction model for a second generation type of optical element for which no data is available. As data for this new part becomes available, the model can be updated.

As such, a second model, such as a hierarchical Bayes (HB) model, is proposed comprising a hierarchy with two layers. The lower layer models the individual datasets and the upper layer models the statistics of the datasets including similarities in the data, as well as variations across datasets. Other model types, whether or not hierarchal, may also be used for the second model to train said first model based on data corresponding to the other configurations.

In other embodiments where both F and G are smooth, the model can be optimized by gradient based optimization. Alternatively, G(•) may also comprise a non-smooth function such as an L1 norm which promotes sparsity. In such a case proximal-splitting methods may be used for optimization. Proximal-splitting methods are described, for example, in *Proximal algorithms in statistics and machine learning*, N G Polson, J G Scott, B T Willard—Statistical Science, 2015-projecteuclid.org; which is incorporated herein by reference.

Where different parties are reluctant to share data, the proposed approaches described herein enable a federated learning where parties (users) need share only their model weights (model parameters $\omega_i$), rather than actual data, for regularization.

As such, using the regularization approaches described herein, domain knowledge can be taken in to account as priors, co-training of models for related sub-components can be done such that universalities are taken into account while preserving the individual characteristics of the components, and/or co-training of models for sub-populations can be done such that universalities are taken into account while preserving the individual characteristics of the each sub-group (e.g., relating to different platforms).

Further embodiments are disclosed in the list of numbered clauses below:

1. A method of tuning a prediction model relating to at least one particular configuration of a manufacturing device, the method comprising:
obtaining a function comprising at least a first function of first prediction model parameters associated with said at least one particular configuration, and a second function of the first prediction model parameters and second prediction model parameters associated with configurations of the manufacturing device and/or related devices other than the at least one particular configuration; obtaining values of the first prediction model parameters based on an optimization of the function; and tuning a prediction model according to said values of the first prediction model parameters to obtain a tuned prediction model.

2. A method according to clause 1, comprising using the tuned prediction model to predict a characteristic of any configuration with a probability.

3. A method according to clause 2, wherein said characteristic comprises a probability of failure of a component associated with the at least one particular configuration.

4. A method according to clause 1, 2 or 3, where the step of obtaining values of the first prediction model parameters comprises obtaining said values via a Bayesian inference.

5. A method according to any preceding clause, comprising obtaining a second model and using the second model to tune or train said prediction model based on data corresponding to the other configurations which show shared trends or characteristics.

6. A method according to clause 5, wherein the second model comprises a hierarchical model.

7. A method according to clause 6, wherein the second model comprises a hierarchical Bayes model.

8. A method according to clause 7, wherein the hierarchical Bayes model comprises a lower layer which models individual datasets corresponding to said other configurations and the upper layer models the statistics of the datasets.

9. A method according to any of clauses 7 or 8, wherein the hierarchical Bayes model is used to update said prediction model as data for the at least one particular configuration becomes available.

10. A method according to any preceding clause, wherein said first function comprises a model specific cost function which is specific to the at least one particular configuration and said second function comprises a regularization function.

11. A method according to clause 8, wherein said optimization comprises jointly minimizing said first function and second function in terms of said first and second prediction model parameters to obtain said values of the first prediction model parameters.

12. A method according to clause 8, or 9, wherein the second function comprises an L2-norm.

13. A method according to clause 8 or 9, wherein the second function comprises an L1-norm and the optimization comprises a proximal-splitting method.

14. A method according to clause 8 or 9, wherein respective datasets relating to each of said configurations have a relation specified by a undirected graph with a graph Laplacian and said second function is based on said Laplacian.

15. A method according to clause 12, wherein said second function is approximated by a summation over neighbouring nodes of an adjacency matrix corresponding to said Laplacian.

16. A method according to any preceding clause, wherein a configuration relates to a particular tool, apparatus or component thereof or any combination of tool, apparatus and components thereof.

17. A method according to clause 14, wherein said tool or apparatus comprises a lithographic tool or apparatus used in the manufacture of integrated circuits.

18. A computer program comprising program instructions operable to perform the method of any preceding clause, when run on a suitable apparatus.

19. A non-transient computer program carrier comprising the computer program of clause 18.

20. A processing device operable to run the computer program of clause 18.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of tuning a prediction model relating to at least one particular configuration of a manufacturing device, the method comprising:
   obtaining a model function comprising at least a first function of first prediction model parameters associated with the at least one particular configuration, and a second function of the first prediction model parameters and second prediction model parameters associated with configurations of the manufacturing device and/or one or more related devices other than the at least one particular configuration;
   obtaining, by a hardware computer, values of the first prediction model parameters based on an optimization of the model function; and
   tuning the prediction model according to the values of the first prediction model parameters to obtain a tuned prediction model.

2. The method as claimed in claim 1, further comprising using the tuned prediction model to predict a characteristic of any configuration with a probability.

3. The method as claimed in claim 2, wherein the characteristic comprises a probability of failure of a component associated with the at least one particular configuration.

4. The method as claimed in claim 1, where the obtaining values of the first prediction model parameters comprises obtaining the values via a Bayesian inference.

5. The method as claimed in claim 1, further comprising obtaining a second model and using the second model to tune or train the prediction model based on data corresponding to the other configurations which show shared trends or characteristics.

6. The method as claimed in claim 5, wherein the second model comprises a hierarchical model.

7. The method as claimed in claim 6, wherein the second model comprises a hierarchical Bayes model.

8. The method as claimed in claim 7, wherein the hierarchical Bayes model comprises a lower layer which models individual datasets corresponding to the other configurations and the upper layer models the statistics of the datasets.

9. The method as claimed in claim 7, wherein the hierarchical Bayes model is used to update the prediction model as data for the at least one particular configuration becomes available.

10. The method as claimed in claim 1, wherein the first function comprises a model specific cost function which is specific to the at least one particular configuration and the second function comprises a regularization function.

11. The method as claimed in claim 1, wherein the optimization comprises jointly minimizing the first function and second function in terms of the first and second prediction model parameters to obtain the values of the first prediction model parameters.

12. The method as claimed in claim 8, wherein the second function comprises an L2-norm.

13. The method as claimed in claim 8, wherein the second function comprises an L1-norm and the optimization comprises a proximal-splitting method.

14. The method as claimed in claim 8, wherein respective datasets relating to each of the configurations have a relation specified by an undirected graph with a graph Laplacian and the second function is based on the Laplacian.

15. The method as claimed in claim 1, wherein a configuration relates to a particular tool, apparatus or component thereof or any combination of tool, apparatus and components thereof.

16. A computer program product comprising a non-transitory computer-readable medium having instructions therein, the instructions, when executed by a computer system, configured to cause the computer system to at least:
obtain a model function with respect to a prediction model relating to at least one particular configuration of a manufacturing device, the model function comprising at least a first function of first prediction model parameters associated with the at least one particular configuration, and a second function of the first prediction model parameters and second prediction model parameters associated with configurations of the manufacturing device and/or one or more related devices other than the at least one particular configuration;
obtain values of the first prediction model parameters based on an optimization of the model function; and
tune the prediction model according to the values of the first prediction model parameters to obtain a tuned prediction model.

17. The computer program product of claim 16, wherein the instructions are further configured to cause the computer system to use the tuned prediction model to predict a characteristic of any configuration with a probability.

18. The computer program product of claim 16, wherein the instructions configured to cause the computer system to obtain values of the first prediction model parameters are further configured to cause the computer system to obtain the values via a Bayesian inference.

19. The computer program product of claim 16, wherein the instructions are further configured to cause the computer system to obtain a second model and use the second model to tune or train the prediction model based on data corresponding to the other configurations which show shared trends or characteristics.

20. The computer program product of claim 16, wherein the first function comprises a model specific cost function which is specific to the at least one particular configuration and the second function comprises a regularization function.

* * * * *